(12) United States Patent
Wingate et al.

(10) Patent No.: US 6,297,750 B1
(45) Date of Patent: Oct. 2, 2001

(54) LINEAR POSITION DETECTING SYSTEM

(75) Inventors: Sidney A. Wingate, Concord; John A. Sotir, Newton, both of MA (US)

(73) Assignee: Dynamics Research Corporation, Andover, MA (US)

( * ) Notice: Subject to any disclaimer, the term of this patent is extended or adjusted under 35 U.S.C. 154(b) by 0 days.

(21) Appl. No.: 09/661,063

(22) Filed: Sep. 13, 2000

Related U.S. Application Data

(60) Provisional application No. 60/154,380, filed on Sep. 16, 1999.

(51) Int. Cl.$^7$ ..................................................... H03M 1/22

(52) U.S. Cl. .................... 341/15; 341/5; 341/11

(58) Field of Search ........................ 340/870.32, 870.34; 250/231, 214; 341/5, 7, 11, 15

(56) References Cited

U.S. PATENT DOCUMENTS

| | | | |
|---|---|---|---|
| 3,739,649 | * | 6/1973 | Pacini et al. ........................ 74/89.2 |
| 4,524,347 | * | 6/1985 | Rogers ..................................... 341/3 |
| 4,584,472 | * | 4/1986 | Wiblin et al. ......................... 250/237 |
| 5,907,200 | * | 5/1999 | Chitayat .................................. 310/12 |

* cited by examiner

Primary Examiner—Patrick Wamsley
(74) Attorney, Agent, or Firm—Weingarten, Schurgin, Gagnebin & Hayes LLP

(57) ABSTRACT

A linear position encoder is provided which is not affected by ambient light, smoke, moisture, particulate matter, and also not affected by electrical interference such as may be caused by stray fields or permanent magnets or magnetic particles. The encoder comprises a linear scale having an excitation loop disposed along the length of the scale and having electrical terminals preferably disposed at one end of the scale. An alternating current is applied to the excitation loop to create an alternating magnetic field. At least one periodic conductive pattern is provided on an outer side of the excitation loop. The periodic pattern has electrical terminals preferably at the same end of the scale as the terminals of the excitation loop. A sensor is provided on a small printed circuit card that is movable in relation to the scale. The card has a pickup loop which receives energy coupled from the scale excitation loop and which induces current in the periodic pattern. The resulting magnetic field is spatially modulated and motion of the sensor in relation to the scale amplitude modulates the output signals to provide an output indication of linear travel along the scale.

9 Claims, 3 Drawing Sheets

PATTERN ON TOP OF BOARD

PATTERN ON TOP OF BOARD

AS VIEWED THROUGH BOARD 16

AC POWER MODULE

US 6,297,750 B1

LINEAR POSITION DETECTING SYSTEM

CROSS REFERENCE TO RELATED APPLICATIONS

This application claims priority under 35 U.S.C. §119(e) to Provisional Patent Application Ser. No. 60/154,380 filed on Sep. 16, 1999; the disclosure of which is hereby incorporated by reference.

STATEMENT REGARDING FEDERALLY SPONSORED RESEARCH OR DEVELOPMENT

N/A

BACKGROUND OF THE INVENTION

The present invention relates to linear position measurement and in particular to linear position encoders.

Linear position encoders are known for measuring the position of a movable element or device along a travel path. One class of linear encoders are electro-optical in which a scale disposed along a travel path contains an array of optically sensible markings which are cooperative with markings on a member movable along the scale. Photosensors associated with the movable member provide electrical signals representative of movement with respect to the scale and provide an output representative of relative position of the movable member in relation to the fixed scale. Such electro-optical encoders can provide accurate linear measurement but are subject to contamination by dirt, dust or debris within the operating environment. Linear encoders are often used in machine tools or in other factory environments in which dust and dirt can be present.

Another class of linear encoders is based on inductive electrical principles. An elongated scale contains an electrical pattern in which a current is caused to flow. A movable member movable along the length of the scale contains an inductive pickup into which current is induced and which is sensed to provide an indication of relative movement of the member in relation to the scale. Such an inductive encoder is subject to electrical interference and is also subject to magnetic and electromagnetic interference which may be caused by the presence of permanent magnets, stray electromagnetic fields and the like.

BRIEF SUMMARY OF THE INVENTION

In accordance with the present invention, a linear position encoder is provided which is not affected by ambient light, smoke, moisture, particulate matter, and also not affected by electrical interference such as may be caused by stray fields or permanent magnets or magnetic particles. The encoder comprises a linear scale having an excitation loop which is composed of a pair of parallel conductors and an interconnecting loop end. The excitation loop is disposed along the length of the scale and has electrical terminals preferably disposed at one end of the scale. An alternating current is applied to the excitation loop to create an alternating magnetic field between the conductors. At least one periodic conductive pattern is provided on an outer side of the excitation loop. The periodic pattern has electrical terminals preferably at the same end of the scale as the terminals of the excitation loop. In a preferred embodiment, a second periodic conductive pattern is provided on the opposite side of the excitation loop from the first periodic conductive pattern. This second periodic pattern has electrical terminals which preferably are on the same end of the scale as the other electrical terminals.

A sensor is provided on a small printed circuit card that is movable in relation to the scale. The card has a central pickup loop which receives energy coupled from the scale excitation loop. The voltage induced in the sensor pickup loop produces a current in two periodic patterns in space quadrature with each other. The resulting magnetic fields are spatially modulated and motion of the sensor in relation to the scale amplitude modulates the output signals to provide an output indication of linear travel along the scale.

BRIEF DESCRIPTION OF THE SEVERAL VIEWS OF THE DRAWING

The invention will be more fully described in the following detailed description and accompanying drawings in which.

DETAILED DESCRIPTION OF THE INVENTION

Figure 1:
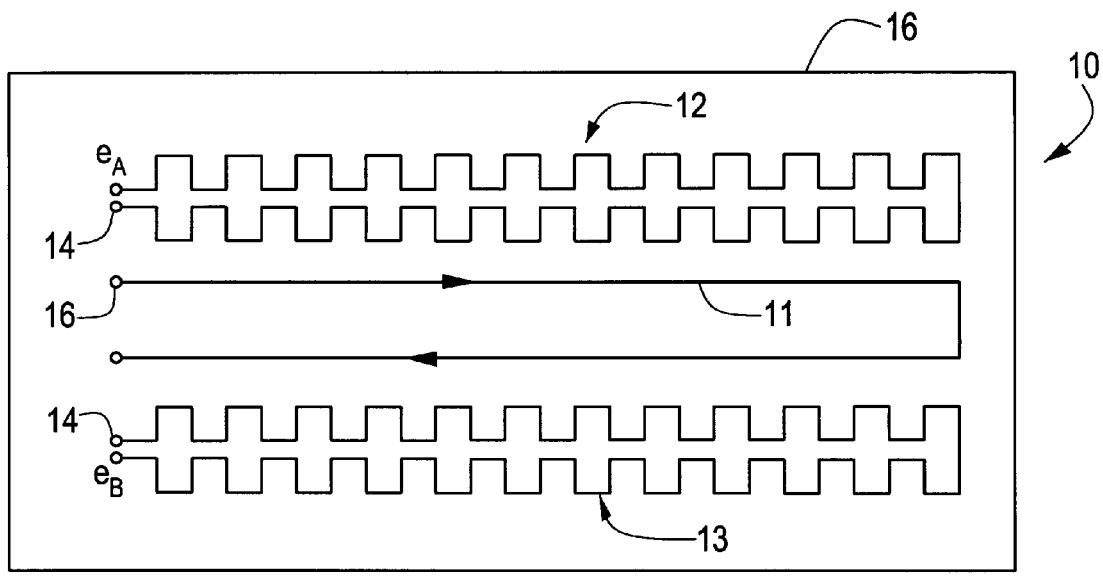
FIG. 1 is a diagrammatic plan view of a scale in accordance with the invention.

Referring to FIG. 1, there is shown a scale 10 in accordance with the invention which includes an excitation loop 11 and conductive periodic patterns 12 and 13 on respective sides of the excitation loop. Electrical terminals 14 are provided at one end of the scale for the excitation loop and periodic patterns. The excitation loop and periodic patterns are formed as printed circuit traces on a nonconductive circuit board 16. The excitation loop 11 is composed of a pair of parallel traces and interconnecting loop end. The repetitive patterns in the illustrated embodiment are of square wave shape as shown in FIG. 1.

Figure 2:
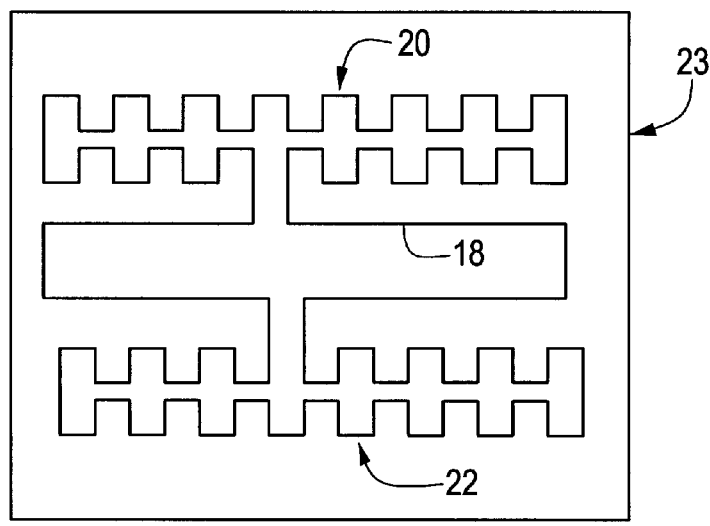
FIG. 2 is a diagrammatic plan view of a sensor in accordance with the invention.

The sensor member is shown in FIG. 2 and includes a centrally disposed conductive loop 18 connected to respective periodic patterns 20 and 22. The pattern is depicted as seen looking through board 16 of FIG. 1. The conductive traces are formed typically by printed circuit techniques on a nonconductive circuit board or substrate 23. The loop 18 is sized to be in alignment with the excitation loop 11 and the repetitive patterns 20 and 22 are configured to be in alignment with the respective patterns 12 and 13. Pattern 22 is phased in space quadrature with pattern 20. The sensor member is mounted for movement along the length of the scale at a fixed gap from the scale.

In use, an alternating current (AC) signal is applied to the terminals 14 of the excitation loop 11 to cause a strong alternating magnetic field between the conductors of the excitation loop. The sensor pickup loop 18 creates current in the periodic patterns 20 and 22 on each side of the pickup loop which causes a magnetic field which is spatially modulated. Motion of the space modulated fields along the scale causes amplitude modulation of the output signals induced in the repetitive patterns 12 and 13 and sensed at their respective output terminals 14.

The sensor member does not require contact with the scale and requires no electrical connections. There is therefore no required electrical cabling to the movable sensor as in conventional encoders.

A typical gap between the movable sensor and the scale is nominally 0.007 inch. The movable sensor should be aligned with the scale such that the track patterns 12 and 13 remain in alignment with patterns 20 and 22 throughout the travel length. The scale 10 is typically mounted on an elongated flat surface of a machine or other instrumentality in which the encoder is employed.

Figure 3:
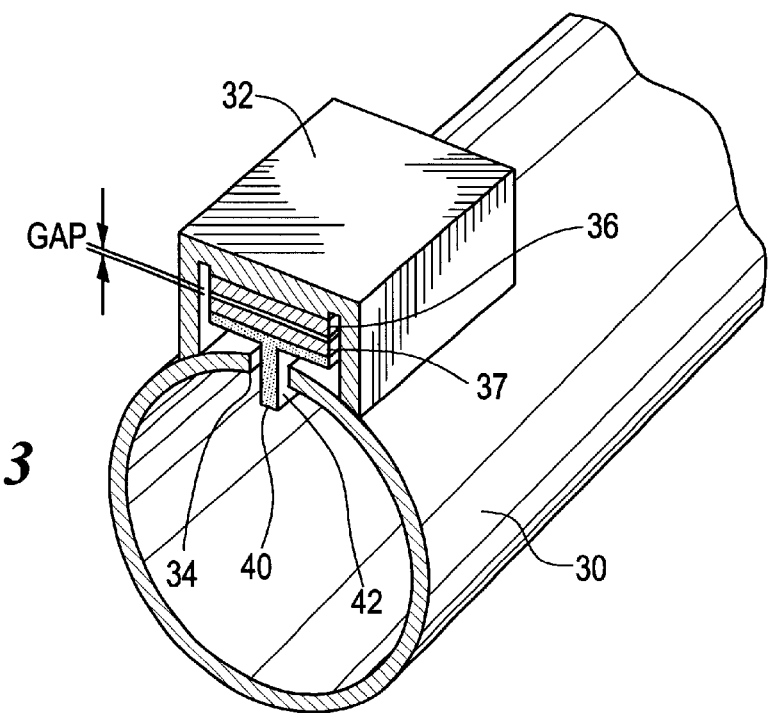
FIG. 3 is a cut-away pictorial view of an encoder according to the invention in one mounting arrangement.

A mounting arrangement for the invention is illustrated in FIG. 3. A housing is provided by a tube 30 extending along a travel path and having a movable cap section 32 attached to the tube. A slot 34 is provided along the travel direction of the tube confronting the cap section. The scale 36 is mounted to the inner surface of the cap section, and the sensor member 37 is attached to a coupler 40 which has an element 42 extending through the slot and movable along the length of the slot to cause movement of the sensor in relation to the fixed scale. The sensor is appropriately mounted to maintain an intended gap between the confronting faces of the sensor and the scale and to maintain alignment of the sensor tracks during movement of the sensor along the scale length.

The output signals from the repetitive pattern tracks of the scale are in the form of a suppressed carrier sideband modulated signal. After amplification, a synchronized phase detector removes the carrier and provides a quadrature pair of motion signals. These signals may be interpolated in conventional manner for higher resolution reading of position.

Figure 4:
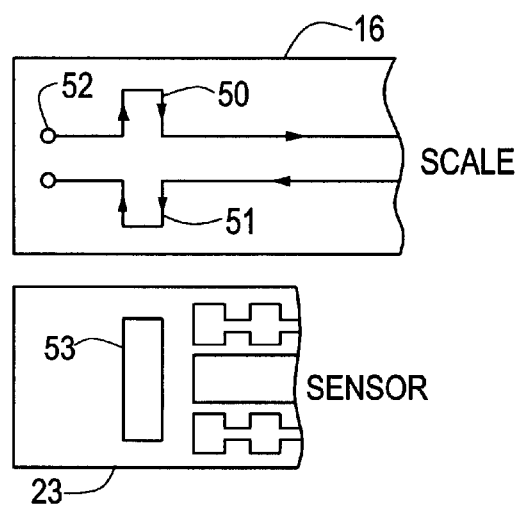
FIG. 4 is a diagrammatic plan view of the connection end of the scale including index traces and cooperative sensor.

A third signal channel can be provided to provide an index pulse for presetting or resetting of a counter for absolute position orientation. The index signal is provided by a short rectangular trace 50 in the excitation loop and a short rectangular trace 51 on the scale as shown in FIG. 4. The sensor has a closed rectangular trace 53 which is of a configuration to align with the index traces 50 and 51. When the sensor is moved to a position where trace 53 is aligned with traces 50 and 51, an output signal is induced at the output terminals 52 of the index trace 51 for use to define a reference position. Movement of the sensor with respect to the reference position provides the index pulse from which the distance traveled along the scale is thereby measured.

Figure 5:
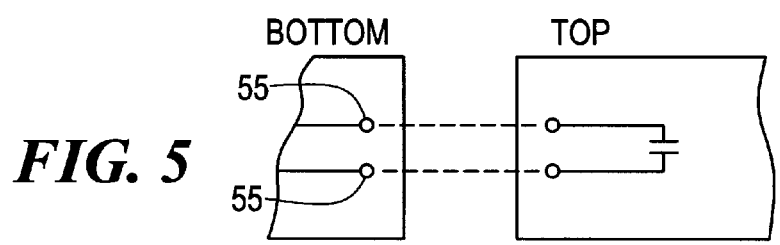
FIG. 5 is a diagrammatic plan view of a tuned sensor.

The current amplitude in the sensor pickup loop and in the repetitive patterns is limited by the voltage amplitude induced from the scale excitation field and by the impedance of the loop. Because the current path is preferably a low resistance copper trace it is of moderate electrical Q such that the current amplitude can be increased by series tuning. A capacitor C can be provided in series with the pickup loop as shown in FIG. 5. The capacitor, such as a surface mounted capacitor, is mounted as in the illustrated embodiment on the top surface of the sensor member and is connected by conductive vias 55 to the pickup loop.

Figure 6A:
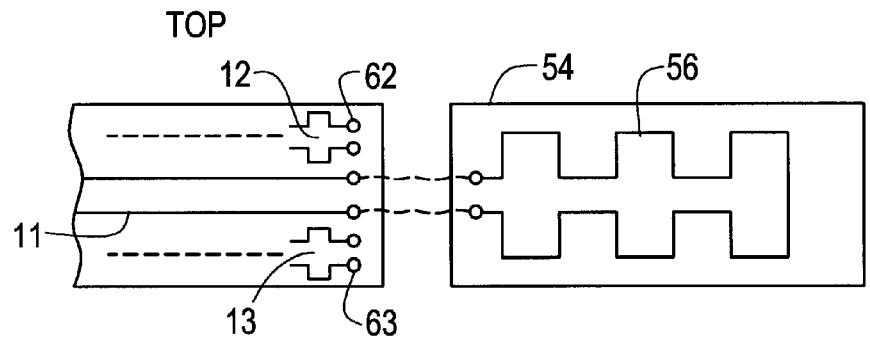
FIGS. 6A and 6B are plan views of a compensation card cooperative with the scale.
Figure 6B:
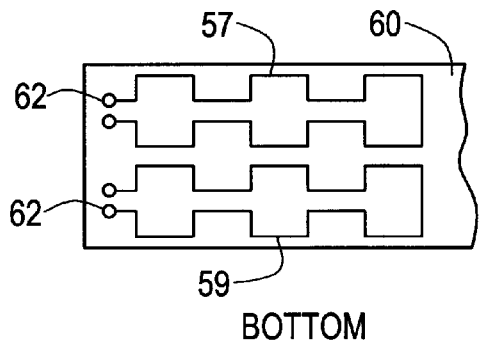
Figure 6C:
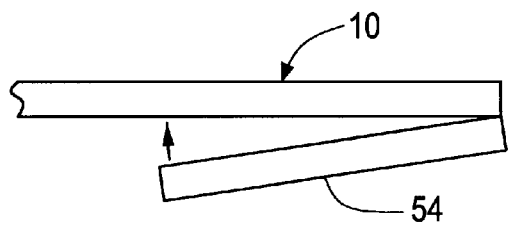
FIG. 6C is an elevation view of the compensation card being positioned on the scale.

Referring to FIGS. 6A and 6C there is shown a compensation card 54 which includes a relatively course repetitive pattern 56 which completes the connection to one end of the excitation loop 11. Matching repetitive patterns 57 and 59 are printed on the bottom 60 of the scale 10 and connected through conductive vias 62 in series with the repetitive tracks 12 and 13 of the scale. The compensation card 54 is mounted flush against the bottom traces of the scale and is manually adjusted along the length of the scale to null any offset voltage. Once the null position is determined, the compensation card is fixed in place with a suitable adhesive. Once the offset voltage is nulled to zero, the nulling is not further affected by any subsequent changes in excitation current level or carrier phase shift which may occur from wear or other changes over time.

Figure 7:
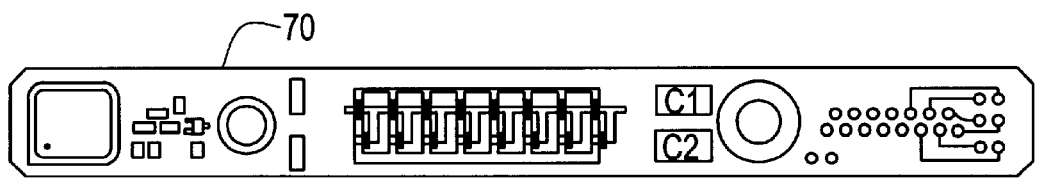
FIG. 7 is a plan view of a power excitation module employed with an encoder.

The alternating excitation current for the scale can be provided by the AC power module shown in FIG. 7. The module includes a circuit card 70 that is the same dimension in width as the scale and is typically housed within the module behind the scale near the terminal end in order to minimize cable resistance to the excitation current. The external conducting cable is preferably in the form of a tightly twisted pair of wires to confine any external field close to the conductors and minimize radiation and susceptibility to the ambient environment. The AC module includes a master oscillator and power amplifier that generates a reference voltage and the excitation current for the scale.

The signal electronics are contained in a circuit card (not shown) connected to the terminals of the repetitive tracks of the scale.

The invention is not to be limited by what has been shown and described, and is to encompass the spirit and full scope of the appended claims.

What is claimed is:

1. A linear position encoder comprising:
    a linear scale having an excitation loop disposed along the length of the scale and electrical terminals for receipt of AC excitation;
    a pair of periodic conductive patterns on respective sides of the excitation loop and having electrical terminals;
    a sensor movable along the length of the scale and having a pair of pickup loops cooperative with the excitation loop of the scale to receive energy coupled from the excitation loop induced voltage that provides alternating current in the two periodic patterns, thence conveyed to the electrical terminals of the periodic patterns to provide an output indication of linear travel of the sensor along the scale.

2. The encoder of claim 1 wherein the
    pair of second periodic conductive patterns are in space quadrature with each other.

3. The encoder of claim 2 wherein the scale is a printed circuit board and wherein the excitation loop and periodic conductive patterns are printed circuit traces provided on the printed circuit board.

4. The encoder of claim 3 wherein the sensor includes a printed circuit card and wherein the pickup loop is a printed circuit pattern provided on the card.

5. The encoder of claim 2 wherein the electrical terminals are at one end of the scale.

6. The encoder of claim 2 wherein the sensor is movable along the scale at a predetermined gap from the scale.

7. The encoder of claim 1 wherein the excitation loop is composed of a pair of parallel conductors and an interconnecting loop end.

8. The encoder of claim 1 wherein the scale includes an index pattern and index output terminals and wherein the sensor includes a cooperative index pattern.

9. The encoder of claim 1 further including a compensation card having a repetitive pattern electrically connected to the excitation loop and cooperative to compensate for offset voltage.

* * * * *